(12) United States Patent
Bagnati et al.

(10) Patent No.: US 11,885,845 B2
(45) Date of Patent: Jan. 30, 2024

(54) INTEGRATED CIRCUIT WITH ON-STATE DIAGNOSIS FOR DRIVER CHANNELS

(71) Applicant: STMICROELECTRONICS S.R.L., Agrate Brianza (IT)

(72) Inventors: Gaudenzia Bagnati, Pogliano Milanese (IT); Stefano Castorina, Milan (IT); Valerio Bendotti, Vilminore di Scalve (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/678,772

(22) Filed: Feb. 23, 2022

(65) Prior Publication Data

US 2023/0266382 A1 Aug. 24, 2023

(51) Int. Cl.
*G01R 31/02* (2006.01)
*H03K 17/687* (2006.01)
*H03K 5/24* (2006.01)
*G01R 31/54* (2020.01)
*G01R 19/165* (2006.01)
*G01R 31/28* (2006.01)

(52) U.S. Cl.
CPC ... *G01R 31/2851* (2013.01); *G01R 19/16571* (2013.01); *G01R 31/54* (2020.01); *H03K 5/24* (2013.01); *H03K 17/6874* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | | |
|---|---|---|---|
| 4,875,448 A | 10/1989 | Dykstra | |
| 4,932,381 A | 6/1990 | Rousseau et al. | |
| 5,469,094 A | 11/1995 | Nessi | |
| 6,348,820 B1 | 2/2002 | Bennett et al. | |
| 6,664,802 B2 | 12/2003 | Wimmer et al. | |
| 9,336,704 B2 | 5/2016 | Li et al. | |
| 9,871,448 B2 | 1/2018 | Yan | |
| 10,340,908 B2 | 7/2019 | Baik et al. | |
| 2004/0227561 A1 | 11/2004 | Balakrishnan | |
| 2009/0195190 A1 | 8/2009 | Fong et al. | |
| 2014/0184185 A1* | 7/2014 | Torrisi | H02H 9/002 323/277 |

* cited by examiner

*Primary Examiner* — Patrick Assouad
*Assistant Examiner* — Haidong Zhang
(74) *Attorney, Agent, or Firm* — Seed IP Law Group LLP

(57) ABSTRACT

An integrated circuit includes a plurality of power transistor driver channels for driving external loads. The driver channels can be selectively configured as high-side (HS) or low-side (LS) driver channels. The integrated circuit includes, for each driver channel, a respective on-state test circuit and a respective controller. The on-state test circuits can be selectively configured to test for HS overcurrent conditions, LS overcurrent conditions, HS open load conditions, and LS open load conditions.

20 Claims, 9 Drawing Sheets

INTEGRATED CIRCUIT WITH ON-STATE DIAGNOSIS FOR DRIVER CHANNELS

BACKGROUND

Technical Field

The present disclosure is related to integrated circuits, and more particularly, to diagnostics for high-side/low-side driver channels.

Description of the Related Art

Some integrated circuits have dedicated driver channels for driving loads external to the integrated circuits. Each driver channel may have a power transistor having source and drain terminals coupled to dedicated output terminals of the integrated circuit. The driver channels may be selectively configured as high-side (HS) driver channels or low-side (LS) driver channels. Internal driver circuitry of the integrated circuit can drive the gate terminal of the power transistor.

In some cases, it is possible that a fault condition may occur at the driver channel while the driver channel is operating. Such fault conditions can include overcurrent conditions and open load conditions. Open load conditions may simply result in poor function of the driver channel. An overcurrent condition may be particularly dangerous to the driver channel as high currents may damage the power transistor for the load.

Accordingly, some integrated circuits have included on-state diagnosis circuitry that attempts to detect fault conditions at the driver channels while the corresponding power transistors are driving the loads. One possible solution includes, for each driver channel, an HS overcurrent detection circuit, an LS overcurrent detection circuit, an HS open load detection circuit, and an LS open load detection circuit. However, such on-state diagnosis circuitry could consume a large amount of area of the integrated circuit.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide an integrated circuit including a plurality of driver channels that can be selectively configured as either HS or LS channels. The integrated circuit includes, for each driver channel, an on-state test circuit. Each on-state test circuit can be selectively configured to perform LS overcurrent detection, HS overcurrent detection, LS open load detection, and HS open load detection. Because a single on-state test circuit can be selectively placed in HS and LS overcurrent and open load detection modes, the on-state test circuit consumes a very small amount of integrated circuit area. Furthermore, on-state diagnosis is performed in a highly efficient and effective manner.

Each driver channel includes an internal power transistor having source and drain terminals coupled to the dedicated output terminals of the integrated circuit. Each driver channel also includes a respective on-state test circuit and a controller coupled to the on-state test circuit. The controller can selectively control the on-state test circuit to operate in HS testing modes or LS testing modes based on the current configuration of the corresponding driver channel. If a driver channel is configured as an HS driver channel, then the controller can control the on-state test circuit to perform HS overcurrent testing and HS open load testing. If a driver channel is configured as an LS driver channel, then the controller can control the on-state test circuit one LS overcurrent testing an LS open load testing.

In one embodiment, an integrated circuit includes a driver channel configured to be selectively operated in a high-side driver mode or a low-side driver mode. The driver channel includes a power transistor, a drain output terminal coupled to a drain of the power transistor, and a source output terminal coupled to a source of the power transistor. The integrated circuit includes an on-state test circuit coupled to the drain output terminal and the source output terminal and including a plurality of switches and a control circuit coupled to the on-state test circuit and configured to control the plurality of switches to place the on-state test circuit in a high-side overcurrent testing mode or a low-side overcurrent testing mode.

In one embodiment, an integrated circuit includes a driver channel configured to be selectively operated in a high-side driver mode or a low-side driver mode. The integrated circuit includes an on-state test circuit coupled to the driver channel and including a first comparator and configured to be selectively operated in a high-side overcurrent testing mode and a low-side overcurrent testing mode. The on-state test circuit is configured to detect a high-side overcurrent condition of the driver channel based on the first comparator in the high-side overcurrent testing mode and to detect a low-side overcurrent condition of the driver channel based on the first comparator in the low-side overcurrent testing mode.

In one embodiment, a method includes operating a driver channel of an integrated circuit by driving a gate terminal of a power transistor of the driver channel and detecting whether a high-side overcurrent condition is present at the driver channel based on an output of a first comparator of an on-state testing circuit in a high-side overcurrent testing mode of the on-state testing circuit. The method includes detecting whether a low-side overcurrent condition is present at the driver channel based on the output of the first comparator of the on-state testing circuit in a low-side overcurrent testing mode of the on-state testing circuit.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
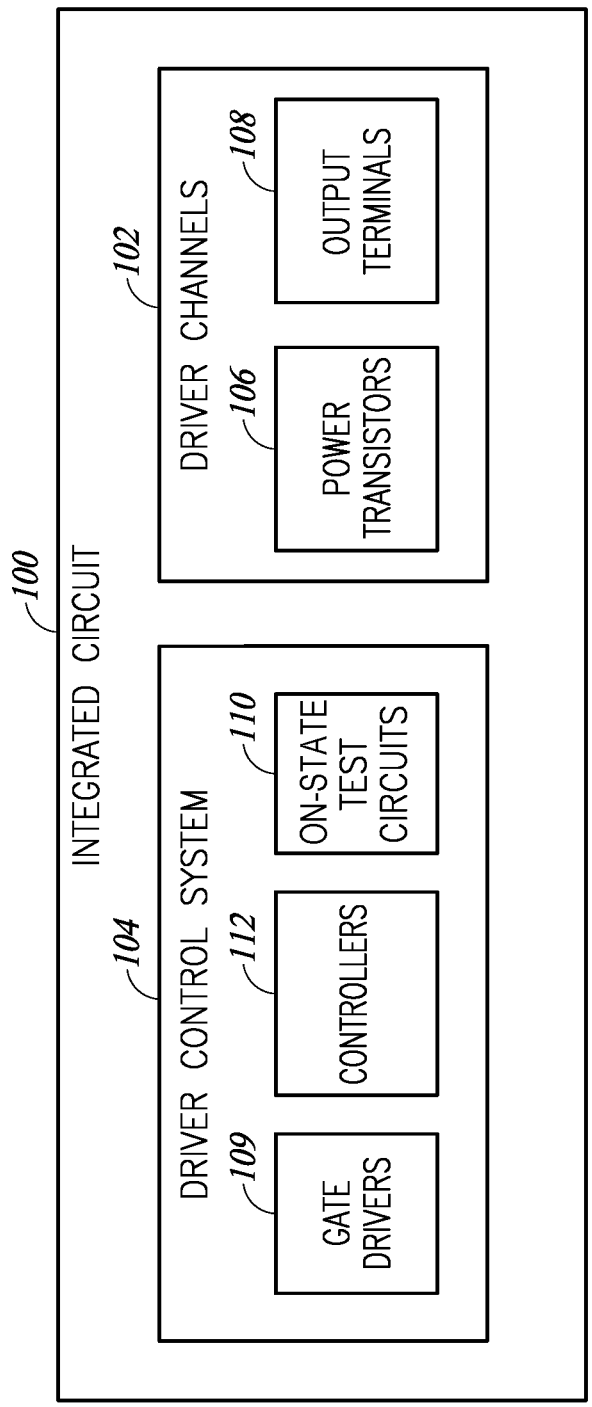
FIG. 1 is a block diagram of an integrated circuit including a plurality of driver channels and a driver control system, according to one embodiment.

FIG. 1 is a block diagram of an integrated circuit 100, according to one embodiment. The integrated circuit 100 includes a plurality of driver channels 102 and a driver control system 104. As will be set forth in more detail below, the driver control system 104 is configured to perform on-state diagnosis on the driver channels 102 in an efficient and effective manner.

Each driver channel 102 includes a respective power transistor 106 and a pair of output terminals 108. The pair of output terminals 108 of the driver channel correspond to output terminals of the integrated circuit 100. The output terminals 108 enable the power transistor 106 to drive a current through a load external to the integrated circuit 100.

In one embodiment, for each driver channel 102, the power transistor 106 includes a source terminal coupled to one output terminal 108 of the pair of output terminals 108 and a drain terminal coupled to the other output terminal 108 of the pair of output terminals 108. Each driver channel 102 can be selectively configured as either an HS driver or an LS driver. In the case of an LS driver, an external load is coupled between an external high voltage source and the drain terminal of the power transistor 106. The source terminal is coupled to ground. In the case of an HS driver, the drain terminal of the power transistor 106 is coupled to an external high voltage source and the external load is coupled between the source terminal and ground.

The driver control system 104 controls the driver channels 102. In particular, the control system receives 104 input data indicating, for each driver channel 102, whether the driver channel 102 is configured as an HS driver channel, a LS driver channel, or is not connected for operation. The driver control system 104 drives the gate terminals of the power transistors 106 in accordance with the corresponding connection scheme to drive currents through the external loads.

The driver control system 104 also performs on-state diagnosis procedures on each of the driver channels 102 while driving the gate terminals of the power transistors 106. The on-state diagnosis detects whether or not there are faults present at the driver channels 102. The faults can include overcurrent faults and open load faults. The driver control system 104 can detect other types of faults without departing from the scope of the present disclosure.

The driver control system 104 includes, for each driver channel 102, a respective gate driver 109. The gate drivers 109 each selectively drive the gate terminal of the corresponding power transistor 106. Accordingly, the gate drivers 109 apply voltages to the gate terminals of the power transistors 106.

The driver control system 104 includes, for each driver channel 102, a respective on-state test circuit 110. Each on-state test circuit 110 performs on-state diagnosis procedures for the corresponding driver channel 102. Each on-state test circuit 110 is coupled to the pair of output terminals 108 of the respective driver channel 102. The on-state test circuits 110 can be selectively placed in an HS overcurrent testing mode, a LS overcurrent testing mode, an HS open load testing mode, and a LS open load testing mode. Overcurrent and open load testing can include comparing voltages at one or both of the pair of output terminals 108 to reference voltages generated by the on-state test circuit 110. Further details regarding the on-state test circuits 110 will be provided below. Various schemes and circuit structures can be utilized for the on-state test circuits 110 without departing from the scope of the present disclosure.

The driver control system 104 includes, for each driver channel 102, a respective controller 112. Each controller 112 is coupled to the on-state test circuit 110 associated with the respective driver channel 102. The controller 112 can control the on-state test circuit 110. Each controller 110 stores information indicating whether the corresponding driver channel is configured as a LS driver, an HS driver, or is not coupled for operation. If the corresponding driver channel 102 is not coupled for operation, then the controller 110 may not cause the on-state test circuit 110 to perform on-state diagnosis procedures. If the corresponding driver channel 102 is configured as an HS driver channel, then the controller 112 controls the on-state test circuit 110 to perform HS on-state diagnosis procedures. If the corresponding driver channel 102 is configured as an LS driver channel, then the controller 112 controls the on-state test circuit 110 to perform LS on-state diagnosis procedures.

Each controller 112 can interpret the signals received from the on-state test circuit 110. Each controller 112 can determine whether or not a fault is present, and what type of fault is present, based on the signals provided by the on-state test circuit 110.

Each controller 112 is coupled to the corresponding gate driver 109 of the respective driver channel 102. The controller 112 controls the gate driver 109 to drive the gate terminal of the corresponding power transistor 106. While the controller 112 is driving the gate terminal, the controller 112 controls the on-state test circuit 110 to determine if any faults are present. If the on-state diagnosis indicates that there is no fault present, then the driver 109 may continue to drive the power transistor 106. If the on-state diagnosis indicates that an overcurrent fault is present, then the controller 112 will cause the gate driver 109 to cease the driving the gate terminal of the power transistor 106.

Each controller may cause the corresponding on-state test circuit 110 to continuously perform on-state diagnosis while the gate driver 109 is driving the power transistor 106. The controller 112 may cause the on-state test circuit 110 to perform overcurrent detection while the power transistor 106 is on. However, in practice, the controller may cause the driver circuit 109 to briefly turn off the power transistor 106 while controlling the on-state test circuit to perform open load testing. However, such open load testing is still considered on-state testing because it is performed during a very brief interruption in operation of the power transistor 106.

Figure 2:
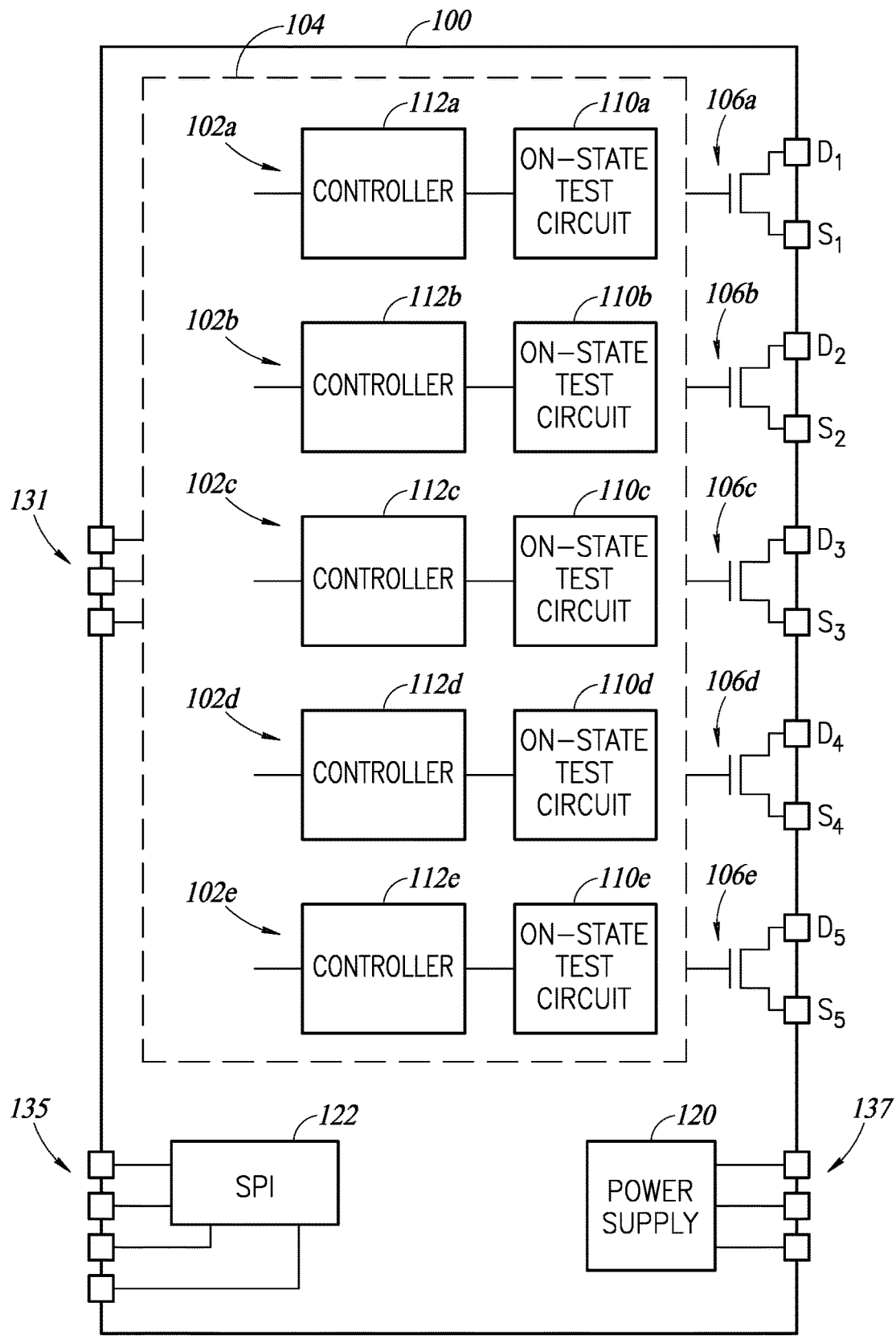
FIG. 2 is a block diagram of an integrated circuit, according to one embodiment.

FIG. 2 is a block diagram of an integrated circuit 100, according to one embodiment. In FIG. 2, the integrated circuit 100 includes five driver channels 102a-102e. Each driver channel 102a-e includes a respective power transistor 106a-e. Each driver channel 102a-e also includes a drain output terminal D1-D5 and a source output terminal S1-S5. The drain output terminals D1-D5 are each coupled to a drain terminal of the corresponding power transistor 106a-e. The source output terminals S1-S5 are each coupled to the source terminal of the corresponding power transistor 106a-e.

Each of the driver channels 102a-e can be configured as either an HS or an LS driver channel. If a driver channel is configured as an HS driver channel, then an external load will be coupled between the source output terminal and ground and the drain output terminal will be coupled to an external high voltage source, such as a high-voltage battery. If a driver channel is configured as an LS channel, then an external load will be coupled between the external high voltage source and the drain terminal and the source terminal will be coupled to ground. In the examples given herein, each of the power transistors 106a-e are N-type power MOSFETs. Alternatively, one or more of the power transistors can include P-type power MOSFETs. The power transistors 106 can include other types of transistors than MOSFETs without departing from the scope of the present disclosure.

The integrated circuit 100 includes a driver control system 104. The driver control system 104 includes, for each driver channel 102a-e, a respective on-state test circuit 110a-e. The driver control system 104 includes, for each driver channel 102a-e, a respective controller 112a-e coupled to the corresponding on-state test circuit 110a-e. The driver control system 104 also includes gate drivers (not shown) each configured to drive a date of the respective power transistor 106a-e. The driver control system 104 of FIG. 2 can function substantially as described in relation to FIG. 1.

The integrated circuit 100 includes a plurality of terminals 131 coupled to the driver control system 104. In the example FIG. 2 there are three terminals 131 coupled to the driver control system 104. However, the integrated circuit 100 may include a different number of terminals 131 than are shown in FIG. 2. The terminals 131 may include idle command terminals, input terminals, output terminals, or other types of terminals.

The integrated circuit 100 includes a power supply module 120 and a plurality of terminals 137 coupled to the power supply 120. The terminals 137 may receive a supply voltage VDD, a ground voltage, and the external high supply voltage. The external high supply voltage is also the voltage utilize externally in driving the loads for each of the driver channels 102a-c. The power supply 120 applies the various voltages to appropriate circuits within the integrated circuit 100. There may be a different number of terminals 137 than shown in FIG. 2 without departing from the scope of the present disclosure.

The integrated circuit 100 includes a serial peripheral interface (SPI) block 122. The integrated circuit 100 includes a plurality of terminals 135 coupled to the SPI block 122. The terminals 135 can include data input terminals, data output terminals, clock terminals, or other types of terminals. The integrated circuit 100 can include a different number of terminal than are shown in FIG. 2 without departing from the scope of the present disclosure. The SPI block can store data related to the fault state and the type of fault state of each driver channel. The SPI block 122 can output data, signals, or alerts related to the state of each driver channel. The SPI block 122 may also receive a request to perform open load on-state diagnosis on one or more of the driver channels 102. The SPI block 122 then communicates with the driver control system 104 to perform open load on-state diagnosis for the driver channels 102. The driver control system 104 reports the results of the open load on-state diagnosis to the SPI block 122. The SPI block 122 can then output the results of the open load on-state diagnosis via the terminals 135. In a similar manner, the driver control system 104 can report the results of overcurrent on-state diagnosis to the SPI block 122. The SPI block 122 can then output the results of the on-state overcurrent diagnosis via the terminals 135. The overcurrent testing may differ from open load testing in that overcurrent testing is continuously performed and is not SPI-dependent.

Figure 3A:
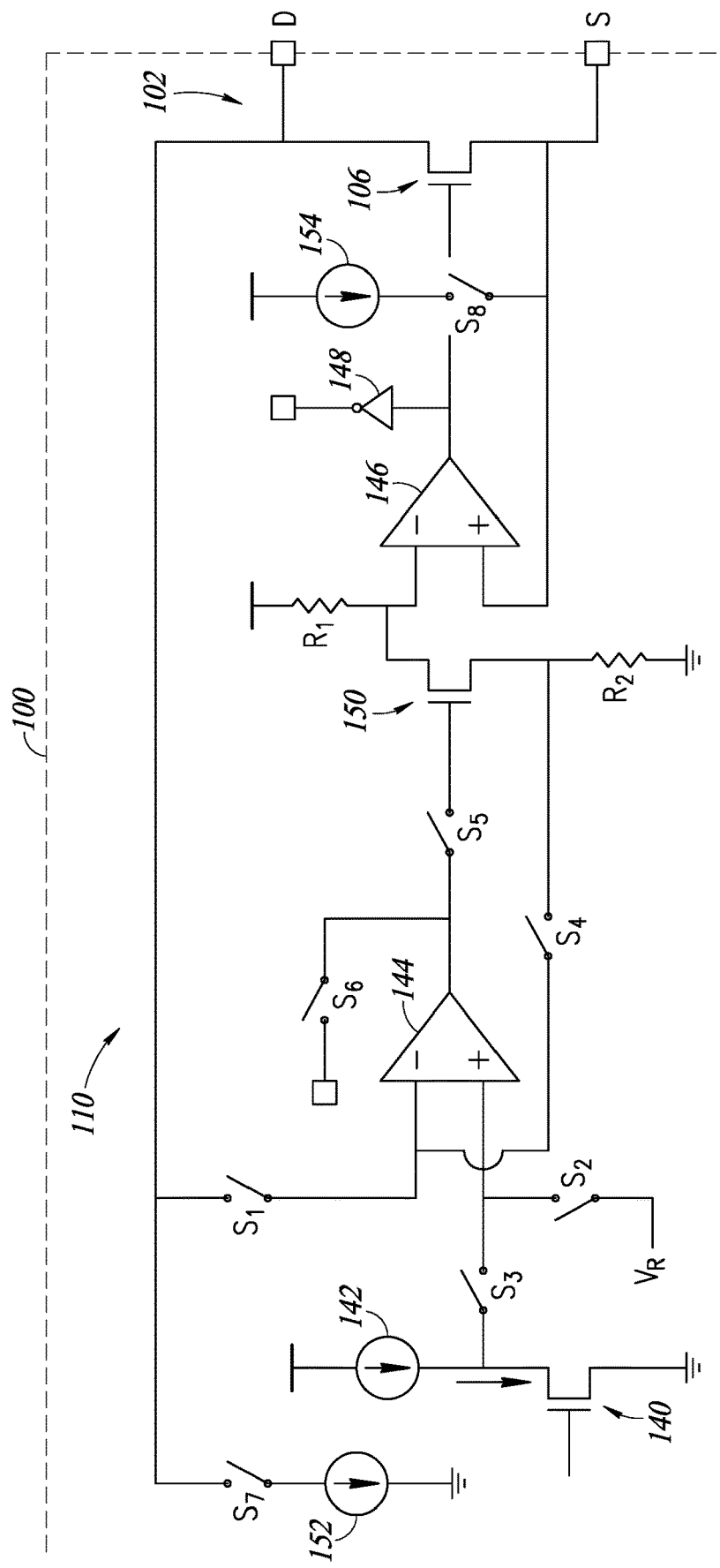
FIG. 3A-3E are schematic diagrams of an on-state test circuit of an integrated circuit, according to one embodiment.

FIG. 3A is a schematic diagram of an on-state test circuit 110 of the integrated circuit 100, according to one embodiment. The on-state test circuit 110 is coupled to a driver channel 112. The driver channel 112 includes a power transistor 106 coupled between a drain output terminal D and a source output terminal. Only a single driver channel 112 in the single on-state test circuit 110 are shown in FIG. 3A. However, as shown in FIG. 2, the integrated circuit 100 may include multiple driver channels 112 and multiple corresponding on-state test circuits 110.

The on-state test circuit 110 includes a plurality of switches S1-S8 and other circuit components. The switches S1-S8 can be selectively operated by the controller 112 to place the on-state test circuit 110 in either LS overcurrent detection mode, HS overcurrent detection mode, LS open load detection mode, or HS open load detection mode. In practice, if the driver channel 102 is configured as a LS driver channel, then the controller 112 may operate the switches S1-S8 to first-place the on-state test circuit 110 in LS overcurrent testing mode and then to place the on-state test circuit 110 in LS open load testing mode. If the driver channel 102 is configured as an HS driver channel, then the controller 112 may first-place the on-state test circuit 110 in HS overcurrent testing mode and then in an open load testing mode.

The on-state test circuit 110 includes a reference transistor 140, a reference current generator 142, and a comparator 144. The source terminal of the reference transistor 140 is coupled to ground. The gate terminal of the reference transistor 140 may receive a driving voltage, such as VDD, to turn on the transistor 140. The drain terminal of the reference transistor 140 is selectively coupled to the noninverting input of the comparator 144 by a switch S3. The current source 142 is coupled between VDD and the drain terminal of the transistor 140. The current source 142 drives a reference current through the transistor 140. An inverting input of the comparator 144 is selectively coupled to the drain output terminal D and, thus, to the drain of the power transistor 106 by switch S1. The noninverting input of the comparator 144 is selectively coupled to a reference voltage VR by a switch S2. The output of the comparator 144 is selectively coupled to a first output terminal of the on-state test circuit 110 by the switch S6. Though not shown in FIG. 3A, an inverter may be coupled between the comparator 144 and the first output terminal.

The on-state test circuit 110 includes a transistor 150, a first resistor R1, and a second resistor R2. The transistor 150 may act as a high voltage switch. The gate terminal of the transistor 150 is selectively coupled to the output of the comparator 144 by switch S5. The source terminal of the transistor 150 is selectively coupled to the inverting input of the comparator 144 by switch S4. The resistor R1 is coupled between the drain terminal of the transistor 150 and the VDD. The resistor R2 is coupled between the source of the transistor 150 and ground.

The on-state test circuit includes a comparator 146, an inverter 148, a current source 152, and a current source 154. The inverting input of the comparator 146 is coupled to the drain terminal of the transistor 150. The noninverting input of the comparator 146 is coupled to the source output terminal S, and, thus, to the source of the power transistor 106. The output of the comparator 146 is coupled to the input of the inverter 148. The output of the inverter 148 is coupled to an output terminal of the on-state test circuit 110. The current source 154 is selectively coupled to the source output terminal S by the switch S8 and is configured to drive a reference current. The current source 154 is coupled to the drain output terminal D by the switch S7 and drives a reference current.

The on-state test circuit 110 can be selectively configured to perform LS overcurrent testing, LS open load testing, HS overcurrent testing, and HS open load testing. The operation of the on-state test circuit 110 will be described in relation to FIGS. 3B-3E.

Figure 3B:
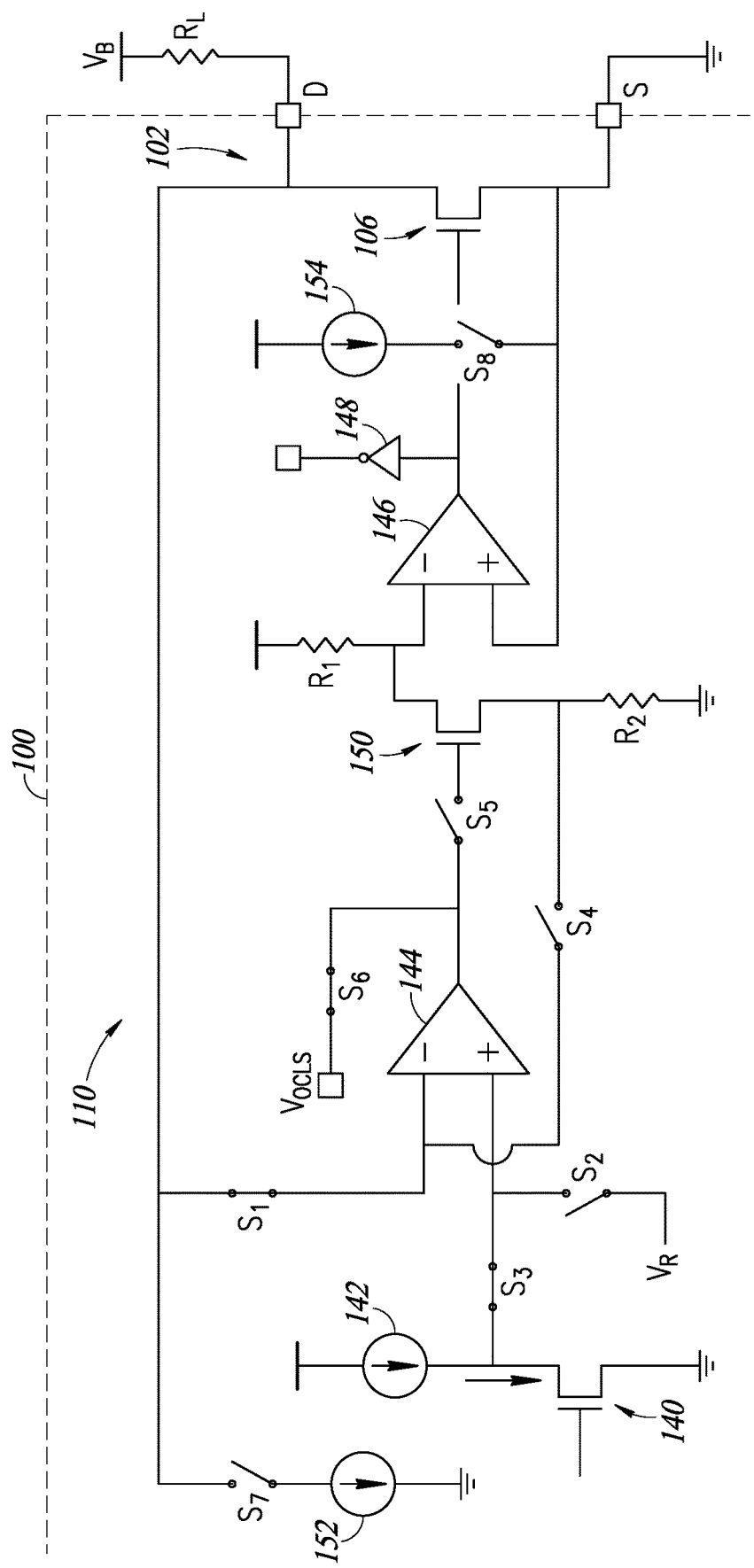

FIG. 3B illustrates the driver channel 102 configured as an LS driver channel, according to one embodiment. In particular, a load is coupled between a battery voltage VB and the drain output terminal D. The load is represented by a load resistance RL. The source output terminals coupled to ground. The driver circuit 109 drives the gate of the power transistor 106 to pass a current from the battery voltage VB through the load resistance RL, into the drain output terminal D, through the drain and source of the transistor 106, and through the source output terminal S to ground.

In FIG. 3B, the on-state test circuit 110 is in an LS overcurrent testing mode, according to one embodiment. The control circuit 112 places the on-state test circuit 110 in the LS overcurrent testing mode by selectively closing the switches S1, S3, and S6, while leaving all other switches open. During the LS overcurrent testing mode, the first output terminal of the on-state test circuit 110 provides a signal VOCLS indicating whether or not an LS overcurrent condition is present or not.

The on-state test circuit 110 performs LS overcurrent testing while the power transistor 106 is on and driving the load current. Because the switch S1 is closed, the inverting input of the comparator 144 is coupled to the drain output terminal D and receives the voltage at the drain of the power transistor 106. Because the switch S3 is closed, the noninverting input of the comparator 144 is coupled to the drain terminal of the reference transistor 140. Because the switch S6 is closed, the output terminal of the comparator 144 is coupled to the first output terminal of the on-state test circuit 110.

The current source 142 drives a reference current through the reference transistor 140. The comparator 144 has the effect of comparing the drain to source voltage of the power transistor 106 to the drain to source voltage of the reference transistor 140. The voltage at the drain terminal is based, in part, on the magnitude of the load current flowing through the load resistance RL. The magnitude of the load current is based, in part, on the load resistance RL. An overcurrent situation occurs when the load resistance RL is unduly small. When the load resistance RL is small, the voltage drop across the load resistance RL is also small, resulting in a high voltage at the drain of the power transistor 106. Accordingly, in an LS configuration, a very high drain voltage at the power transistor 106 may indicate the presence of an overcurrent condition.

The voltage at the drain of the reference transistor 140 may correspond to a type of reference voltage. This is because the current source 142 drives a steady reference current through the transistor 140. This results in a steady reference voltage at the drain of the transistor 140. Because the switch S3 is closed, the noninverting input of the comparator 144 receives the drain voltage of the transistor 140.

The comparator 144 indicates the presence of an LS overcurrent condition when the drain voltage of the power transistor 106 is higher than the drain voltage of the reference transistor 140. The output of the comparator 144 goes low when the drain voltage of the power transistor 106 is greater than the drain voltage of the reference transistor 140, thereby indicating the presence of an LS overcurrent condition. Because switch S6 is closed, the first output terminal receives the output of the comparator 144. When the output of the comparator 144 is low, the first output terminal of the on-state test circuit 110 indicates the presence of an LS overcurrent condition. When the output of the comparator 144 is high, the first output terminal of the on-state test circuit 110 indicates that an LS overcurrent condition is not present. Though not shown in FIG. 3B, an inverter may be coupled between the output of the comparator 144 and the first output terminal, thereby causing VOCLS to go high when an LS overcurrent condition is present.

Figure 3C:
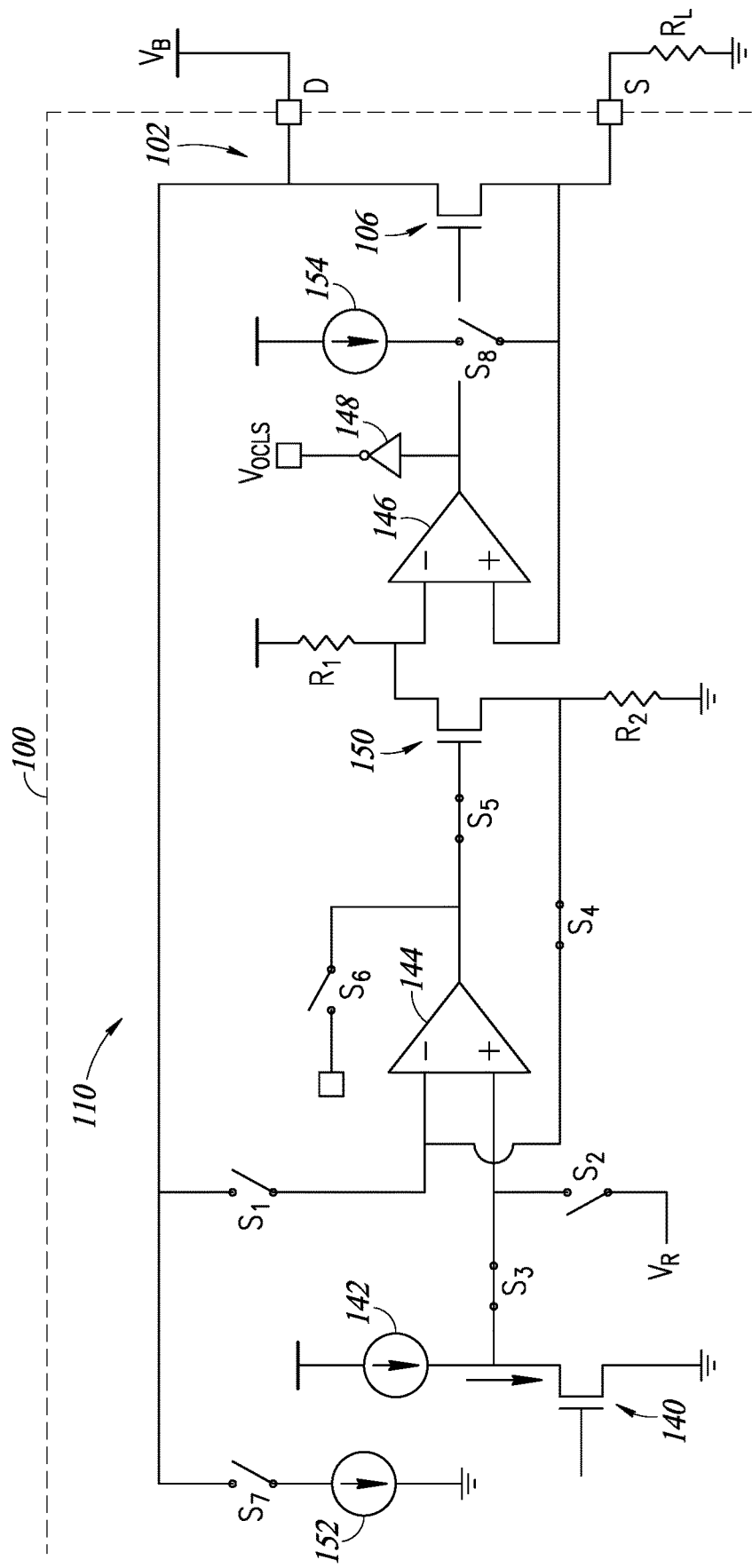

FIG. 3C illustrates the driver channel 102 configured as an HS driver channel, according to one embodiment. In particular, the drain output terminal D receives the battery voltage VB. A load, represented by the load resistance RL, is coupled between the source output terminal S and ground. The driver circuit 109 drives the gate of the power transistor 106 to pass a load current from the battery voltage VB through the drain output terminal D, through the power transistor 106 to the source output terminal S, and through load resistance RL to ground.

In FIG. 3C, the on-state test circuit 110 is in an HS overcurrent testing mode, according to one embodiment.

The control circuit 112 places the on-state test circuit 110 in the HS overcurrent testing mode by selectively closing the switches S3, S4, and S5, while leaving all other switches open. During the HS overcurrent testing mode, the second output terminal of the on-state test circuit 110 provides a signal VOCHS indicating whether or not a HS overcurrent condition is present or not.

The on-state test circuit 110 performs HS overcurrent testing while the power transistor 106 is on and driving the load current. Because the switch S4 is closed, the inverting input of the comparator 144 is coupled to the source terminal of the transistor 150. Because the switch S3 is closed, the noninverting input of the comparator 144 is coupled to the drain terminal of the reference transistor 140. Because the switch S5 is closed, the output terminal of the comparator 144 is coupled to the gate terminal of the transistor 150.

The comparator 144 has the effect of driving the gate terminal of the transistor 150 because the switch S5 is closed. If the output of the comparator 144 is high, then the transistor 150 is turned on. This causes a reference current to flow from VDD through the resistor R1, to the transistor 150, and through the resistor R2 to ground. This reference current will cause a known voltage drop across the resistors R1 and R2. The inverting input of the comparator 144 receives the source voltage of the transistor 150. The inverting input of the comparator 146 receives the drain voltage of the transistor 150.

The comparator 146 has the effect of comparing the drain to source voltage of the reference transistor 140 to the drain to source voltage of the power transistor 106. The voltage at the source output terminal S is based, in part, on the magnitude of the load current flowing through the load resistance RL. The magnitude of the load current is based, in part, on the load resistance RL. An overcurrent situation occurs when the load resistance RL is unduly small. When the load resistance RL is small, the voltage drop across the load resistance RL is also small, resulting in a high drain to source voltage of the power transistor 106. Accordingly, in an LS configuration, a very high drain to source voltage at the power transistor 106 may indicate the presence of an overcurrent condition.

In the HS overcurrent testing mode, the comparator 144 acts as an operational amplifier that translates the drain voltage of the reference transistor 140 as a voltage drop across the resistor R1. The comparator 146 indicates that an overcurrent condition is present when the drain to source voltage of the power transistor 106 is greater than the drain to source voltage of the reference transistor 104. When the output of the comparator 146 is low, the HS overcurrent condition is present. The inverter 148 inverts the output of the comparator 146 and the voltage VOCHS at the second output terminal goes high when an overcurrent condition is present. When an overcurrent condition is not present, the output of the comparator 146 is high and VOCHS is low.

One aspect of the on-state test circuit 110 is that detection of the LS overcurrent condition and detection of the HS overcurrent condition are both based on the output of the comparator 144. In the LS overcurrent testing mode, the output of the comparator 144 directly indicates whether or not an overcurrent condition is present. In the HS overcurrent testing mode, the output of the comparator 144 drives the gate of the transistor 150. The driving of the transistor 150 causes the reference current to flow through the transistors R1 and R2. The voltage at the drain terminal of the transistor 150 is provided directly to the inverting input of the comparator 146. While the output of the comparator 146 directly indicates whether the HS overcurrent conditions present, the output of the comparator 146 is based, in part, on the output of the comparator 144.

Figure 3D:
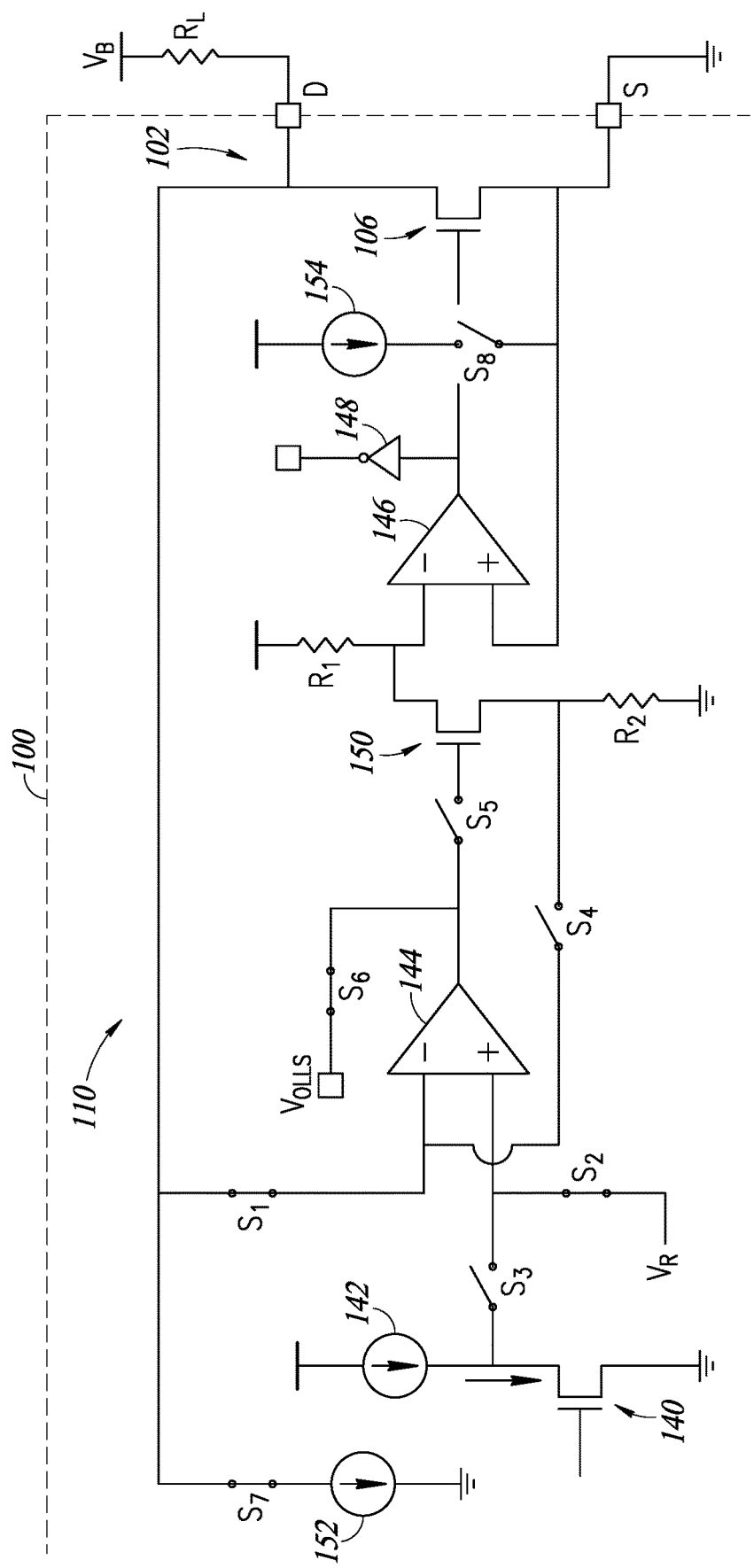

In FIG. 3D, the driver channel 102 is configured as an LS driver channel. The on-state test circuit 110 is in the LS open load testing mode. This is accomplished by closing the switches S1, S2, and S7 in turning on the current source 152. Closing the switch S7 has the effect of enabling the current source 152 to drive reference current through the load RL. Closing the switch S1 has the effect of coupling the inverting input of the comparator 144 to the drain output terminal D. Closing the switch S2 has the effect of coupling the noninverting input of the comparator 144 to the reference voltage VR. In one embodiment, the reference voltage VR is a bandgap voltage.

When a command is received to perform LS open load testing, the controller 112 causes the switches S1, S2, and S7. The controller 112 also turns off the transistor 106 for a brief period of time. The comparator 144 has the effect of comparing the drain to source voltage of the transistor 106 to the reference voltage VR. If the load resistance RS present, the voltage at the drain output terminal D rises. If the voltage at the drain output terminal of the drain output terminal D surpasses the reference voltage VR, then the output of the comparator 144 goes low, indicating that there is not an open load condition present. Accordingly, the value of the voltage signal VOLLS at the first output terminal of the test circuit 110 indicates that there is not an open load condition present.

If the load is not present (open load condition), then the current source 152 is capable of maintaining the drain output terminal D substantially at ground. This causes the output of the comparator 144 to remain high. The value of the voltage signal VOLLS at the first output terminal of the test circuit 110 indicates that there is an open load condition present.

Figure 3E:
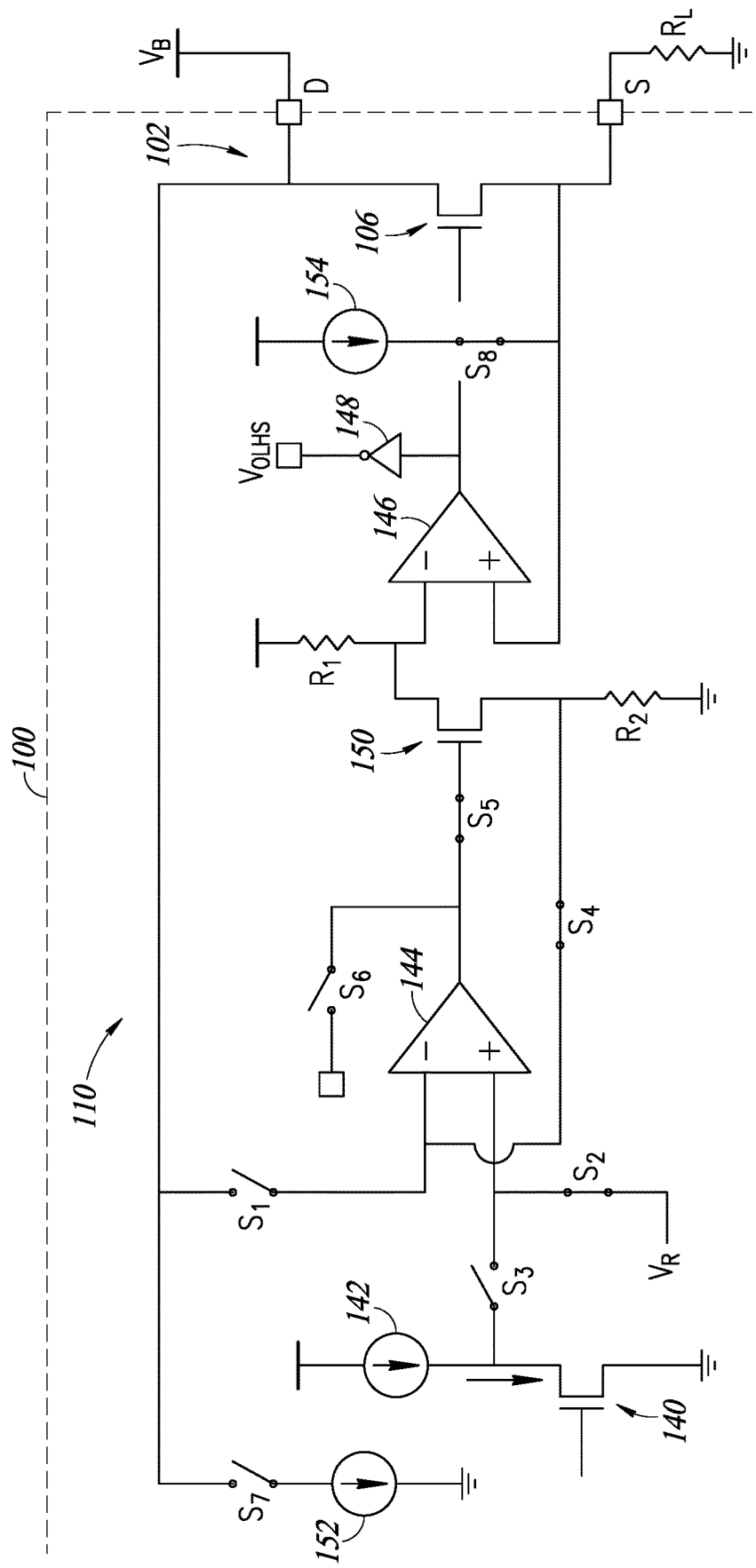

In FIG. 3E, the driver channel 102 is configured as an HS driver channel. The on-state test circuit 110 is in the HS open load testing mode. This is accomplished by closing the switches S2, S4, S5, and S8 in turning on the current source 154. Closing the switch S8 has the effect of enabling the current source 154 to drive a reference current through the load RL. Closing the switch S4 has the effect of coupling the inverting input of the comparator 144 to the source of the transistor 150. Closing the switch S2 has the effect of coupling the noninverting input of the comparator 144 to the reference voltage VR. Closing the transistor S5 has the effect of coupling the output of the comparator 144 to the gate terminal of the transistor 150. In one embodiment, the reference voltage VR is a bandgap voltage.

When a command is received to perform HS open load testing, the controller 112 causes the switches S2, S4, S5, and S8. The controller 112 also turns off the transistor 106 for a brief period of time. The comparator 144 functions as an operational amplifier and translates the reference voltage VR is a voltage drop across the resistor R1. This causes the inverting input of the comparator 146 to receive a voltage corresponding to the drain output terminal minus the reference voltage VR. With the current source 154 driving a reference current, if the load is present the voltage at the source output terminal S will drop and the comparator 146 will indicate that the open load condition is not present. The value of VOLHS at the second output terminal of the on-state test circuit 110 will indicate that an open load condition is not present. The controller 112 will then restart the power transistor 104.

If an open load condition exists, then the current source 154 is capable of keeping the source output terminal S of the battery voltage VB and the noninverting input of the comparator 146 will be higher than the inverting input of the comparator 146, causing the comparator 146 to indicate that the open load conditions present. The value of VOLHS at the second output terminal of the on-state test circuit 110 will indicate that an open load fault is present.

In one embodiment, a LED is coupled to the integrated circuit 100 and indicates whether driver channel 102 is operating. In one embodiment, the HS and LS open load testing is performed for a duration less than 100 μs. The LED will be turned off for the duration of the open load testing. However, this duration is so short, that the human eye cannot detect that testing has occurred. The driver channel 102 may continue to operate even if an open load fault is present.

Figure 4A:
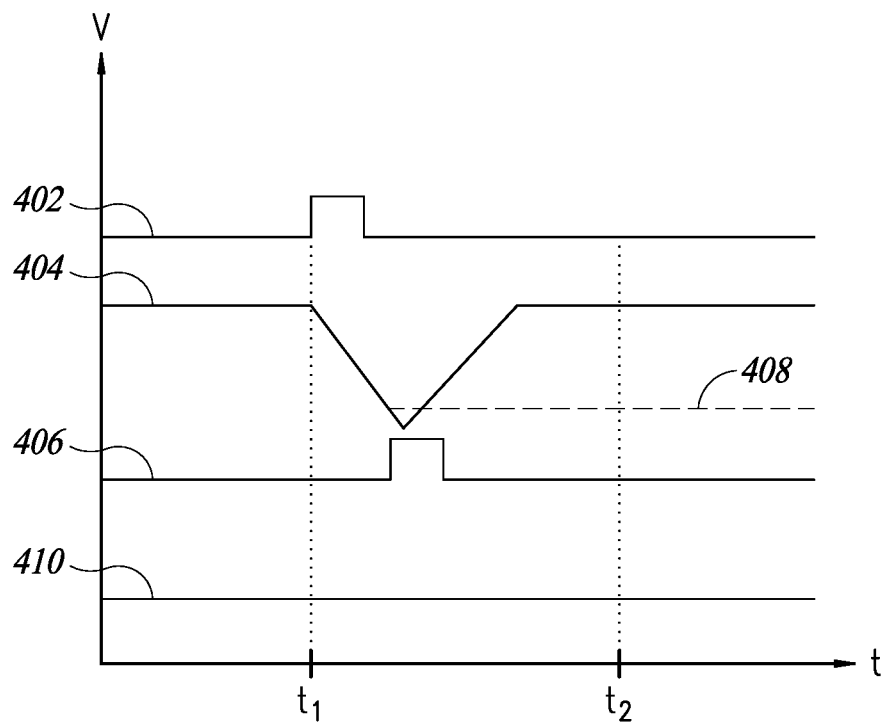
FIGS. 4A and 4B are graphs illustrating signals associated with an on-state test circuit, according to one embodiment.
Figure 4B:
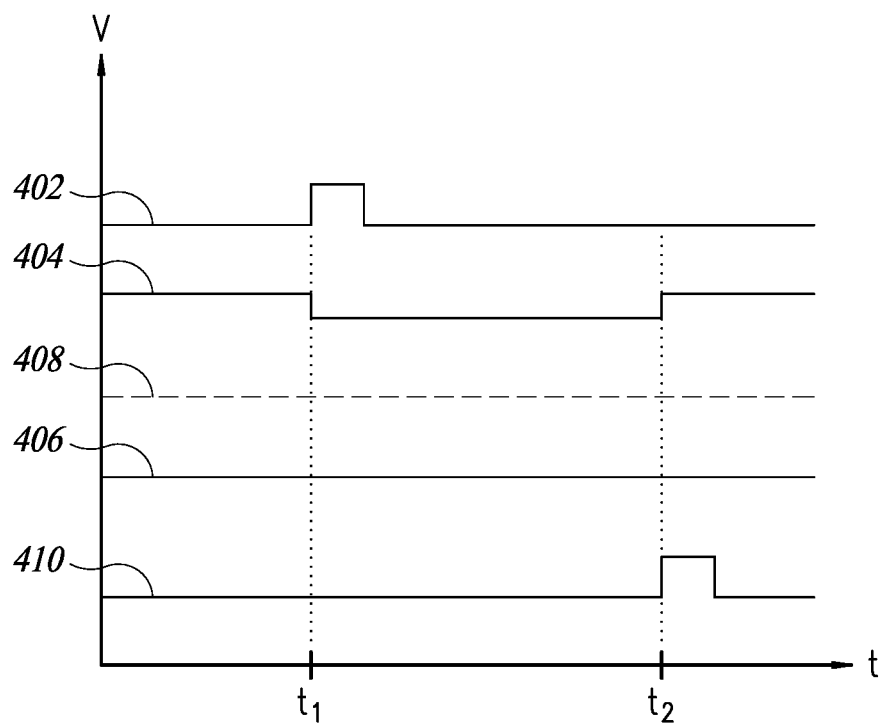

FIGS. 4A and 4B are graphs indicating signals associated with an HS open load testing procedure. In FIG. 4A, an HS open load condition is not present. In FIG. 4B, and HS open load condition is present.

With reference to FIG. 4A, the curve 402 corresponds to a request for an HS open load test to occur. The curve 404 represents the drain to source voltage of the power transistor 106. The curve 408 indicates the value of the reference voltage VR. The curve 406 represents the output of the comparator 146. The graph 410 represents whether the controller 112 determines that an open load fault is present.

At time T1, the curve 402 goes high, indicating that a request for an HS open load test has been received. This causes the controller 112 to place the on-state test circuit 110 in the HS open load testing mode. The corresponding switches are closed and the current source 154 begins to pass the reference current. Because an open load fault is not present, the voltage of the drain to source voltage of the power transistor 104 drops below the reference voltage VR. This causes the comparator 146 to go high and power transistor 104 is suddenly switched on again. The power transistor 106 may turn back on before time T2. The value of VOLHS indicates that an open load condition is not present. At time T2, the controller checks to see if the output of the comparator 146 went high during the testing period between T1 and T2. Because the output of the comparator 146 went high during the testing period, the curve 410 remains low after time T2.

In graph 4B, when testing begins, the drain to source voltage of the power transistor 106, as represented by the graph 404, remains higher than the reference voltage VR during the testing period. Accordingly, the output of the comparator 146, as indicated by the curve 406, does not go high. Because the output of the comparator did not go high during the testing period, at time T2 the controller determines that an open load conditions present as indicated by the curve 410 going high at time T2.

LS open load testing and LS and HS overcurrent testing can be performed with similar principles as described in relation to FIGS. 4A and 4B.

Figure 5:
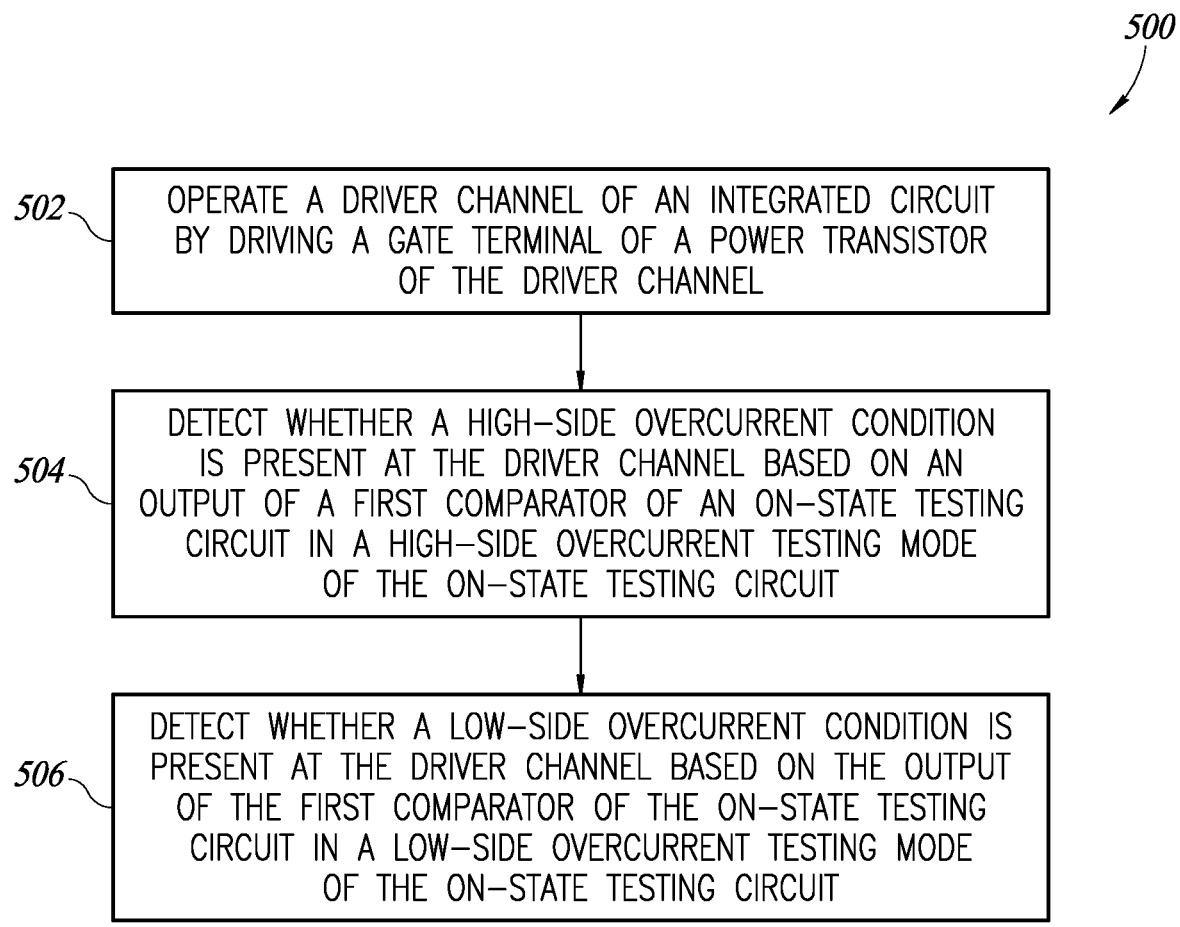
FIG. 5 is a flow diagram of a method for operating an integrated circuit, according to one embodiment.

FIG. 5 is a flow diagram of a method 500 for performing on-state diagnosis on driver channels of the integrated circuit, according to one embodiment. The method 500 can utilize components, systems, and processes described in relation to FIGS. 1-4B. At 502, the method 500 includes operating a driver channel of an integrated circuit by driving a gate terminal of a power transistor of the driver channel at 504, the method 500 includes detecting whether a high-side overcurrent condition is present at the driver channel based on an output of a first comparator of an on-state testing circuit in a high-side overcurrent testing mode of the on-state testing circuit. At 506, the method 500 includes detecting whether a low-side overcurrent condition is present at the driver channel based on the output of the first comparator of the on-state testing circuit in a low-side overcurrent testing mode of the on-state testing circuit.

In one embodiment, an integrated circuit includes a driver channel configured to be selectively operated in a high-side driver mode or a low-side driver mode. The driver channel includes a power transistor, a drain output terminal coupled to a drain of the power transistor, and a source output terminal coupled to a source of the power transistor. The integrated circuit includes an on-state test circuit coupled to the drain output terminal and the source output terminal and including a plurality of switches and a control circuit coupled to the on-state test circuit and configured to control the plurality of switches to place the on-state test circuit in a high-side overcurrent testing mode or a low-side overcurrent testing mode.

In one embodiment, an integrated circuit includes a driver channel configured to be selectively operated in a high-side driver mode or a low-side driver mode. The integrated circuit includes an on-state test circuit coupled to the driver channel and including a first comparator and configured to be selectively operated in a high-side overcurrent testing mode and a low-side overcurrent testing mode. The on-state test circuit is configured to detect a high-side overcurrent condition of the driver channel based on the first comparator in the high-side overcurrent testing mode and to detect a low-side overcurrent condition of the driver channel based on the first comparator in the low-side overcurrent testing mode.

In one embodiment, a method includes operating a driver channel of an integrated circuit by driving a gate terminal of a power transistor of the driver channel and detecting whether a high-side overcurrent condition is present at the driver channel based on an output of a first comparator of an on-state testing circuit in a high-side overcurrent testing mode of the on-state testing circuit. The method includes detecting whether a low-side overcurrent condition is present at the driver channel based on the output of the first comparator of the on-state testing circuit in a low-side overcurrent testing mode of the on-state testing circuit.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
  a driver channel configured to be selectively operated in a high-side driver mode or a low-side driver mode and including:
    a power transistor;
    a drain output terminal coupled to a drain of the power transistor; and
    a source output terminal coupled to a source of the power transistor;
    wherein in the high-side driver mode, an external load is coupled between the source and ground, and the drain is coupled to an external high voltage source;
    wherein in the low-side driver mode, the external load is coupled between the external high voltage source and the drain, the source is coupled to ground;

an on-state test circuit coupled to the drain output terminal and the source output terminal and including a plurality of switches; and a control circuit coupled to the on-state test circuit and configured to control the plurality of switches to place the on-state test circuit in a high-side overcurrent testing mode or a low-side overcurrent testing mode.

2. The integrated circuit of claim 1, wherein the control circuit is configured to control the plurality of switches to selectively place the on-state test circuit in a high-side open load testing mode and a low-side open load testing mode.

3. The integrated circuit of claim 1, wherein the on-state test circuit includes a reference transistor, is configured to detect a high-side overcurrent condition in the high-side overcurrent testing mode based on the reference transistor and the power transistor, and is configured to detect a low-side overcurrent condition in the low-side overcurrent testing mode based on the reference transistor and the power transistor.

4. The integrated circuit of claim 3, wherein the on-state test circuit includes a first comparator having:

a first input that is coupled to a source terminal of the reference transistor; and an output, wherein the on-state test circuit is configured to detect the high-side overcurrent condition based on the output of the first comparator in the high-side overcurrent testing mode and to detect the low-side overcurrent condition based on the output of the first comparator in the low-side overcurrent testing mode.

5. The integrated circuit of claim 4, wherein an on-state diagnosis circuit includes a second comparator having:

a first input communicatively coupled to the output of the first comparator; and an output, wherein the output of the first comparator indicates whether a low-side open load condition is present in a low-side open load testing mode, wherein the output of the second comparator indicates whether a high-side open load condition is present in the high-side open load testing mode.

6. The integrated circuit of claim 5, wherein the first comparator includes a second input that is selectively coupled to the drain output terminal in the low-side overcurrent testing mode.

7. The integrated circuit of claim 6, wherein the second comparator includes a second input that is selectively coupled to the source output terminal in the high-side overcurrent testing mode.

8. The integrated circuit of claim 1, comprising a driver coupled to the control circuit and a gate of the power transistor and configured to drive the power transistor.

9. An integrated circuit, comprising:

a driver channel configured to be selectively operated in a high-side driver mode or a low-side driver mode, the driver channel including:

a power transistor;

a drain output terminal coupled to a drain of the power transistor; and a source output terminal coupled to a source of the power transistor;

wherein in the high-side driver mode, an external load is coupled between the source and ground, and the drain is coupled to an external high voltage source;

wherein in the low-side driver mode, the external load is coupled between the external high voltage source and the drain, the source is coupled to ground; and an on-state test circuit coupled to the driver channel and including a first comparator and configured to be selectively operated in a high-side overcurrent testing mode and a low-side overcurrent testing mode, wherein the on-state test circuit is configured to detect a high-side overcurrent condition of the driver channel based on the first comparator in the high-side overcurrent testing mode and to detect a low-side overcurrent condition of the driver channel based on the first comparator in the low-side overcurrent testing mode.

10. The integrated circuit of claim 9, wherein the on-state test circuit includes a second comparator having an input communicatively coupled to the output of the first comparator.

11. The integrated circuit of claim 10, wherein an output of the first comparator indicates whether the low-side overcurrent condition is present in the low-side overcurrent testing mode, wherein the output of the second comparator indicates whether the high-side overcurrent condition is present in the high-side overcurrent testing mode.

12. The integrated circuit of claim 9, wherein the on-state test circuit is configured to be selectively operated in a low-side open load testing mode and a high-side open load testing mode.

13. The integrated circuit of claim 12, wherein the on-state test circuit is configured to detect a high-side open load condition of the driver channel based on the first comparator in the high-side open load testing mode and to detect a low-side open load condition of the driver channel based on the first comparator in the low-side overcurrent testing mode.

14. The integrated circuit of claim 13, wherein the on-state test circuit includes a second comparator having an input communicatively coupled to the output of the first comparator, wherein the output of the first comparator indicates whether the low-side open load condition is present in the low-side open load testing mode, wherein the output of the second comparator indicates whether the high-side open load condition is present in the high-side open load testing mode.

15. The integrated circuit of claim 12, comprising a control circuit coupled to the on-state test circuit, wherein the on-state test circuit includes a plurality of switches, wherein the control circuit is configured to control the switches to selectively place the on-state test circuit in either the high-side overcurrent testing mode, the low-side overcurrent testing mode, the high-side open load testing mode, or the low-side open load testing mode.

16. A method, comprising:

operating a driver channel of an integrated circuit by driving a gate terminal of a power transistor of the driver channel;

detecting whether a high-side overcurrent condition is present at the driver channel based on an output of a first comparator of an on-state testing circuit in a high-side overcurrent testing mode of the on-state testing circuit; and detecting whether a low-side overcurrent condition is present at the driver channel based on the output of the first comparator of the on-state testing circuit in a low-side overcurrent testing mode of the on-state testing circuit; and wherein in a high-side driver mode, an external load is coupled between a source terminal of the power transistor and ground, and a drain terminal of the power transistor is coupled to an external high voltage source, wherein in a low-side driver mode, the external load is coupled between the external high voltage source and the drain terminal of the power transistor, the source terminal of the power transistor is coupled to ground.

17. The method of claim 16, comprising selectively placing the on-state testing circuit in the high-side overcurrent testing mode or the low-side overcurrent testing mode by selectively controlling a plurality of switches of the on-state testing circuit.

18. The method of claim 16, comprising:
indicating whether the low-side overcurrent condition is present with the output of the first comparator; and
indicating whether the high-side overcurrent condition is present with an output of a second comparator coupled to the first comparator.

19. The method of claim 16, comprising selectively placing the on-state testing circuit in one of the high-side overcurrent testing mode, the low-side overcurrent testing mode, a high-side open current testing mode, and a low-side open current testing mode by selectively controlling a plurality of switches of the on-state testing circuit.

20. The method of claim 17, comprising:
indicating, with the output of the first comparator, whether a low-side open load condition is present in a low-side open load testing mode of the on-state test circuit; and
indicating, with an output of a second comparator whether a high-side open load condition is present in a high-side open load testing mode of the on-state testing circuit.

* * * * *